United States Patent
Bening et al.

(10) Patent No.: US 6,684,381 B1
(45) Date of Patent: Jan. 27, 2004

(54) HARDWARE DESCRIPTION LANGUAGE-EMBEDDED REGULAR EXPRESSION SUPPORT FOR MODULE ITERATION AND INTERCONNECTION

(75) Inventors: Lionel Bening, Plano, TX (US); Bryan Hornung, Plano, TX (US); Robert Pflederer, Champaign, IL (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 560 days.

(21) Appl. No.: 09/675,725

(22) Filed: Sep. 29, 2000

(51) Int. Cl.[7] .............................................. G06F 17/50
(52) U.S. Cl. .................. 716/18; 716/1; 716/3
(58) Field of Search ................... 716/1, 3, 18; 717/106, 717/107, 114, 120–123, 136, 140, 141, 143

(56) References Cited

U.S. PATENT DOCUMENTS

| | | | | |
|---|---|---|---|---|
| 5,604,895 A | * | 2/1997 | Raimi | 395/500 |
| 5,937,190 A | * | 8/1999 | Gregory et al. | 395/704 |
| 6,289,498 B1 | * | 9/2001 | Dupenloup | 716/18 |
| 6,574,787 B1 | * | 6/2003 | Anderson | 716/18 |
| 2002/0194172 A1 | * | 12/2002 | Schreiber | 707/4 |

OTHER PUBLICATIONS

IEEE Std. 1076–1993, IEEE Standard VHDL Language Reference Manual, Jun. 6, 1994, Section 8.2 –"Assertion Statement", pp. 113/114 and Section 8.3 –"Report Statement", pp. 114/115.

IEEE Std. 1364–1995, IEEE Standard Hardware Description Language Based on The Verilog Hardware Description Language, Oct. 14, 1999.

* cited by examiner

*Primary Examiner*—Vuthe Siek

(57) ABSTRACT

A method of providing hardware description language-embedded regular expression support for module iteration and interconnection. Regular expressions such as those used in the Perl programming language are used in a preprocessing process to generate instances and interconnections in a hardware description to automate the generation of repetitive code for a Hardware Description Language (HDL). This is accomplished by generating HDL code with embedded regular expressions, analyzing the code to identify the regular expressions and checking to see that the code complies with the HDL grammar rules. A data structure is generated for each module or submodule and these data structures are then elaborated to expand them into the instances and interconnections. A text generator traverses the elaborated data structures and generates HDL compliant text.

45 Claims, 2 Drawing Sheets

HARDWARE DESCRIPTION LANGUAGE-EMBEDDED REGULAR EXPRESSION SUPPORT FOR MODULE ITERATION AND INTERCONNECTION

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

FIELD OF THE INVENTION

This invention relates generally to the field of hardware description languages. More particularly, this invention relates to a method of providing regular expression support for module iteration (instantiation) and interconnection in hardware description languages.

BACKGROUND OF THE INVENTION

A hardware description language (HDL) is a computer language used to describe electronic circuits. The description can describe the circuit at a number of different levels. For example, a hardware description language can be used to describe the interconnection of modules, sub-modules, transistors, resisters, capacitors, etc. Hardware description languages can also be utilized to describe the logical operation of logic gates, flip-flops and the like in digital systems and to describe the transfer of vectors of information between registers.

One of the most popular hardware description languages is the IEEE standard Verilog™. In this, and other HDLs, when multiple iterations of the same type of component (module) are used in a particular arrangement and interconnected with one another and/or other types of modules, an individual description of each module "instance" of each module type is generated to represent the particular module instance and it's interconnection. Manually generating each iteration of a particular module type can be quite tedious. So, the IEEE, in its current working draft of IEEE 1364 (draft 5) Verilog™ proposal (See IEEE Proposed Standard 1364-2000 (Draft 5) "IEEE Standard Hardware Description Language Based on the Verilog Hardware Description Language", IEEE, Inc., New York, N.Y., USA, March, 2000, and "IEEE Standard 1076-1993 IEEE VHDL Language Reference Manual", IEEE, Inc., New York, N.Y., USA, Jun. 6, 1994) proposes a standard technique using preprocessing at the interconnect level in a "for loop" to achieve iteration and interconnection. The example provided in this proposal is repeated below as EXAMPLE 1 for convenience:

```
genvar i;
generate
    for (i=0; i<4; i=i+1)
        begin:word
        sms_16b216t0 p
        (.clk    (clk),
         .csb    (csx),
         .ba     (ba[0]),
         .addr   (adr[10:0]),
         .rasb   (rasx),
```

-continued

```
         .casb   (casx),
         .web    (wex),
         .Udqm   (dqm[2*i+1]),
         .ldqm   (dqm[2*i]),
         .dqi    (data[15+16*i:16*i]),
         .dev_id (dev_id3[4:0])
         );
```

EXAMPLE 1

In this example, a module named sms_16b216t0 is to be instantiated and interconnected four times as the variable "i" is iterated from values 0 through 4. Each of the lines following the first line represents a port on the module with signal names, as will be appreciated by those familiar with Verilog™.

Unfortunately, "for loops" and "generate loops" suffer from several disadvantages. The use of "for loops" in preprocessing was added as an extension to the Verilog language in response to the user community's desire to provide a capability similar to that of the VHDL "generate loop". However, "for loops" and "generate loops" can be burdensome and inefficient to code. In addition, when "for loops" and "generate loops" are used in preprocessing to generate the instances and connections, but the connection specification still has to be checked against the modules being connected to assure that the preprocessing was specified successfully. This is because the interconnect module signals are not developed from the modules being interconnected. Instead, the interconnection module signal specification is checked against the modules being interconnected. This leads to potential errors that can reduce the efficiency of the coding of the interconnection.

It is generally recognized as good hardware design practice to use the same signal name in a receiving module as in a transmitting module (see for example, M. Keating and P. Bricaud, "Reuse Methodology Manual", Kluwar Academic Publishers, 1999.). For example, if the clock signal name in the design for a clock-generating module is "CK", use of "CK" as the signal name for the corresponding nets on modules that receive that clock signal makes the net function clear to anyone reading the design description. This accepted practice has prompted many designers to develop a program that automatically generates a module that interconnects sub-modules. Designers in many development labs have turned to preprocessors, outside of the standard HDLs (Verilog or VHDL) language definition, to automatically generate interconnect HDL modules. These preprocessors are generally written in the PERL language, and may invoke PERL's support of regular expression matching. They often combine input-output port naming of the interconnected sub-modules with rules supplied from another file.

BRIEF SUMMARY OF THE INVENTION

The present invention relates generally to a regular expression support for hardware description languages and methods therefor. Objects, advantages and features of the invention will become apparent to those skilled in the art upon consideration of the following detailed description of the invention.

In accordance with an exemplary embodiment, a method consistent with the invention of iterating instances and connections in a Hardware Description Language include: receiving hardware description language (HDL) code with embedded regular expressions to define instances and interconnections of a module; identifying the regular expressions within the code; and elaborating the instances and interconnections of the module based upon the regular expressions.

Another method of iterating instances and interconnections in a hardware description language consistent with an embodiment of the invention includes: providing Hardware Description Language (HDL) code using regular expressions to define instances and interconnections of a module; and instantiation and interconnection processing the HDL code by: analyzing the code to identify the regular expressions; applying HDL grammar rules to the code; generating a data structure corresponding to the module defined by the code; elaborating the data structure into instances and interconnections of the module defined by the regular expressions in the code; and generating HDL compliant text by traversing the instances and interconnections of the elaborated data structure and translating each instance and interconnection into HDL compliant text.

A computer system for processing Hardware Description Language (HDL) code consistent with embodiments of the invention includes a processor. An input circuit coupled to the processor receives HDL code having embedded regular expression descriptions of instances and interconnections. A storage arrangement is coupled to the processor for storing computer programs and data. A program receives the HDL code and elaborates the HDL code into explicit instances and interconnections describing a selected element of hardware.

In another embodiment consistent with the invention, an electronic storage medium stores instructions which, when executed on a programmed processor, carry out a process of iterating instances and interconnections in a Hardware Description Language (HDL) including: receiving Hardware Description Language code with embedded regular expressions to define instances and interconnections of a module; identifying the regular expressions within the code; and elaborating the instances and interconnections of the module based upon the regular expressions.

A method of describing a module in a Hardware Description Language (HDL) includes: providing a module name using HDL code; creating port descriptions for a port on the module using the HDL code; describing instantiation and interconnection of the module using regular expressions within the HDL code; and elaborating the module according to the regular expressions describing the instantiation and interconnection.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
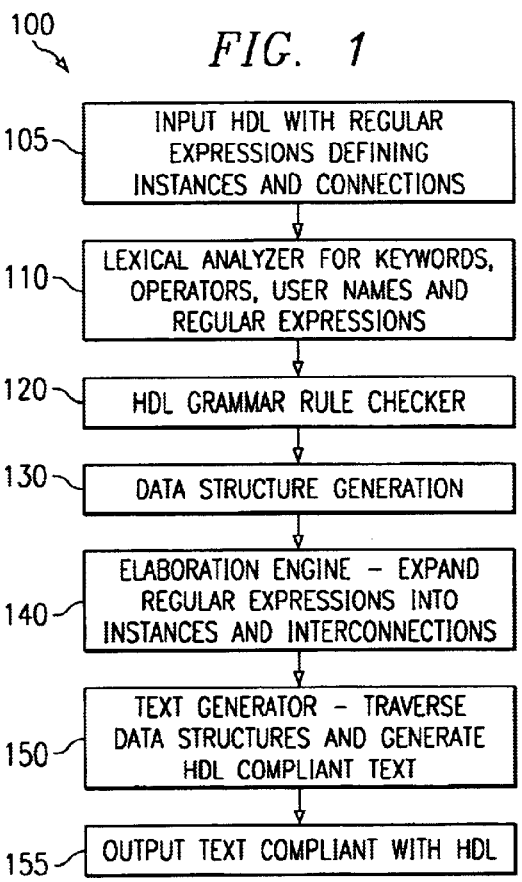
FIG. 1 is a flow chart illustrating a process consistent with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described.

The term "regular expressions" as used herein are expressions consistent with the meaning of the term as used in the "Perl" programming language to describe expressions that are used to match text using special characters. The Perl programming language contains support for a rich set of features associated with regular expressions. Regular expressions are described in most tutorials on the Perl programming language. Regular expressions are sometimes referred to in the literature as "regexes", "RE's" and "regexps".

An embodiment of the present invention, as prototyped, supports module iteration and interconnection within the hardware description language. Compared with the current HDL for-loop and generate-loop techniques, the prototype implementation has the advantages of: improved designer productivity by use of interconnected submodule port names that the designer has already entered and rule-based generated interconnection that supports consistency across a project.

The present invention utilizes regular expressions embedded within an HDL to accomplish the module iteration (instantiation) and interconnection. The regular expressions used to implement this invention are preferably a subset of standard Perl regular expressions used to call out the desired iteration and interconnection. Details of supported regular expressions supported by Perl are readily publicly available, for example, in "Programming Perl" Third Edition, by L. Wall, T. Christiansen, J. Orwant—O'Reilly & Associates, Sebastopol, Calif., July, 2000. Several of the connection rules used to implement a prototype of the present invention (utilizing the public domain regx.c program, Copyright 1993, version 0.12 available from the Free Software Foundation, Inc., 675 Mass Avenue, Cambridge, Mass. 02139 to handle regular expressions) is given in TABLE 1 below. Alternatives to regx.c can be readily developed by those skilled in the art by reference to the regular expressions and their associated rules given in TABLE 1 below.

TABLE 1

| Regular expression | Match rule | HDL Applicability | |
|---|---|---|---|
| [a-d0-4] | matches any character of set | port | instance |
| string1 \| string2 \| string3 | matches string1 or string2 or string3 | port | instance |
| . | matches any [a-ZA-Z0-9_] character | port | |
| x? | matches 0 or 1 x's, where x is any of the above | port | |
| x* | matches 0 or more x's | port | |
| x+ | matches 1 or more x's | port | |

TABLE 1-continued

| Regular expression | Match rule | HDL Applicability |
|---|---|---|
| $ | matches the end-of-string | port |
| (regular expression) | remembers the match for later reference | port instance |

To create the initial code used by the present invention to iterate and interconnect various modules, Perl-like HDL code can be generated using the above rules. Search tools and text editors have used regular expressions for many years, thus, regular expression matching and search library functions suitable for use or modification to implement the present invention are widely available, for example from the Free Software Foundation, Inc.

Once the initial code containing regular expressions is generated applying the appropriate regular expression syntax to effect the iteration and connection, the code can be pre-processed, in one embodiment of the invention, to generate the final Verilog™ code as illustrated in the flow chart 100 of FIG. 1. In this flow chart, the process starts with manual generation of code using regular expressions to designate instances and connections at 105. At 110, the code is analyzed, e.g. in a Verilog parser, to recognize key words, operators, user names and regular expressions in a lexical analyzer process. Lexical analyzer (parser) software is known and available from various sources including the "flex" program (fast lexical analyzer generator) Copyright 1990, Regents of the University of California and the "Bison" program (YACC compatible parser generator, i.e. syntax analyzer) programs available from the Free Software Foundation, Inc. These tools can be adapted to provide the Verilog™ lexical and syntax analysis used to implement the present invention. This and other lexical analyzer programs can be extended to recognize regular expressions.

When key words, operators, user names or regular expressions are recognized in 110, calls are made to a Verilog™ syntax analyzer at 120 that puts the code in a correct grammatical context consistent with Verilog™ syntax rules, if necessary, or provide messages or fixes where grammar errors are encountered. Syntax analyzer 120 makes calls to a data structure generator at 130 that represents the code in the form of data structures based on the Verilog™ language with extensions to account for the regular expressions. The data structure generator generates any suitable data structure (e.g. list, linked list, double linked list, etc.) for representing the module in accordance with the regular expression. Verilog™ syntax analyzer software is known and available from various sources as described above.

The data structures created at 130 are processed by an HDL elaboration engine at 140 to elaborate instances of the data structures based upon traversing the data structures and expanding the regular expressions into instances and interconnections. At this stage, explicit connections are inserted into the data structures wherever implicit connections existed in the initial code. In a prototype, this was accomplished by invoking the public domain regex.c program described above.

Finally, the data structures resulting from 140 are processed by a text generator at 150 that traverses the detailed data structures produced by 140 to create standard Verilog™. This can be readily accomplished by those having ordinary skill in the art by traversing the data elements of each of the detailed data structures and generating Verilog™ code that describes the design represented by these detailed data structures. The Verilog™ code is then output at 155. Thus, blocks 110, 120, 130, 140 and 150 together serve to elaborate the HDL code of 105 (that uses regular expressions to represent a hardware description) into code that provides an explicit detailed description of the hardware. Thus, these steps can collectively be described as elaborating the HDL code of 105.

While the above process is described in terms of flow chart 100 depicting a linear flow from top to bottom, the process may be implemented in a somewhat recursive hierarchical manner. That is, upon recognition of a regular expression at 110, calls can be made to the grammar rule checker 120 which in turn may call the data structure generator 130. Intermediate results can then be stored and the process returned to 110 to identify the next significant program code element. Moreover, although disclosed in terms of a pre-processing method, since the regular expressions are used as an extension of the standard HDL, the process could be implemented within the HDL, e.g. made a part of Veriog™. Other equivalent variations of the process will occur to those skilled in the art.

Figure 2:
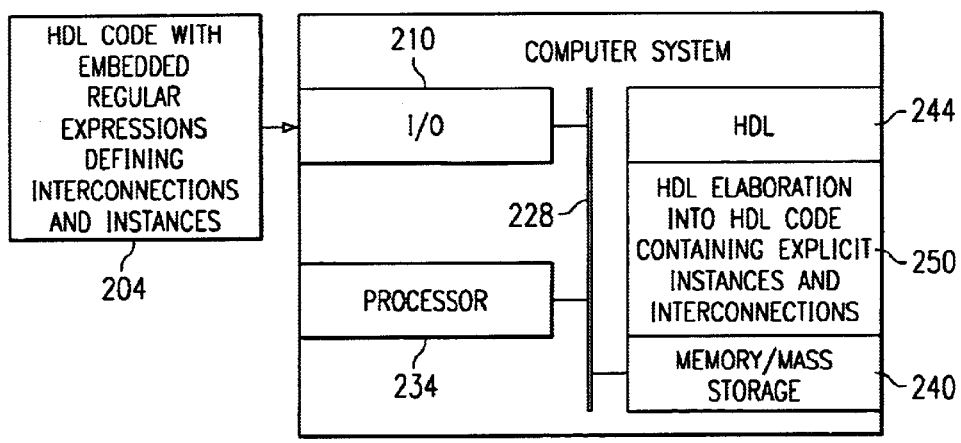
FIG. 2 is a block diagram of a computer system operating in accordance with an embodiment of the present invention.

Referring now to FIG. 2, an overall system diagram using the present invention is illustrated as 200. HDL code 204 using regular expressions embedded therein to define interconnections and instances is generated to describe the hardware of interest using any suitable mechanism. This code 204 is supplied to an input interface 210 (e.g. via keyboard entry, disc or electronic transfer) of a computer system 220. This interface is coupled in a conventional manner via a system bus 228 to a processor (e.g. a microprocessor) 234. Also connected to processor 234 via system bus 228 is memory and mass storage 240, which may encompass semiconductor Random Access Memory (RAM), Read Only Memory (ROM) as well as mass storage devices such as hard disc drive(s) and other suitable storage devices as is known in the art. The memory and/or mass storage runs a Hardware Description Language (HDL) 244 which includes or operates in conjunction with a program or programs 250 that provides the functions described in connection with FIG. 1 above for elaboration of HDL code with embedded regular expression descriptions of instances and interconnections into explicit instances and interconnections. Once the code 204 has been processed by 250, normal functions can be carried out using the HDL 244 in a known manner.

Figure 3:
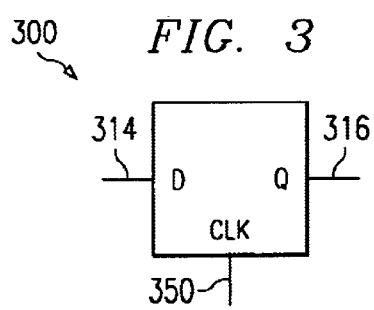
FIG. 3 is a diagram of a D flip-flop described by EXAMPLE 2.

In order to understand how regular expressions can be used to accomplish instantiation and interconnection, a simple example in Verilog™ is useful. Consider a circuit that includes four D flip flops. In order to represent this circuit in Verilog™, four instances of a D flip flop such as D flip-flop 300 of FIG. 3 are required. D flip-flop 300 has a D input 314, a Q output 316 and a clock input 350, and operates as a conventional well known positive edge triggered D flip-flop would be expected to operate.

An example of Verilog™ code for a D flip flop module such as D flip-flop 300 is shown as EXAMPLE 2 below:

```
module dff(clk,d,q);
    input clk;
    input d;
    output q;
    reg q;
    always @ (posedge clk)
        q <= d;
```

```
                        endmodule
```

EXAMPLE 2

In EXAMPLE 2, the module is called "dff" with D and clock inputs "d" and "clk", respectively, and a Q output "q" that responds to the positive edge of the signal "clk" to set the value of "q" to equal the value of "d".

The following three examples (EXAMPLES 3–5) show the use of regular expressions to generate Verilog™ instances and interconnections of the D flip-flop of FIG. 3. In EXAMPLE 3, the bit selection is derived from the regular expression implying four instances:

```
        module dffX4(clk,d,q);
            input clk;
            input [0:3] d;
            output [0:3] q;
        dff f([0–3])  (
                    .d      (d[$1]),
                    .q      (q[$1])
                  );
        endmodule
```

EXAMPLE 3

In EXAMPLE 3 above, the instances of "dff" are represented by the term "dffx4" to represent that four instances are required. The common clock signal "clk" is a common interconnection among all four flip flops. The fact that four Instances (zero through three) of the "d" input and "q" output are to be created is represented by the bracketed terms "[0:3]". The input and output ports on the instantiated D flip flops are designated by the period preceding the port names as ".d" and ".q" with the respective signals (representing interconnections) at these ports designated as "d[$1]" and "q[$1]".

In the next EXAMPLE 4, the connection rules for "d" and "q" are combined:

```
        module dffX4(clk,d,q);
            input clk;
            input    [0:3] d;
            output   [0:3] q;
        dff f([0–3]) (
                    .(q|d)    ($2 [$1])
                  );
        endmodule
```

EXAMPLE 4

In EXAMPLE 4, the connection for "q" and "d" are joined in a single statement with their signals represented as the scalars "$2" and "$1" respectively as will be appreciated by those skilled in Perl or other languages using regular expressions.

Finally, in EXAMPLE 5 below, shareable interconnection rules are defined:

```
        'define RULE_D .d (d[$1])
        'define RULE_Q .q (q[$1])
        module dffX4(clk,d,q);
            input clk;
            input    [0:3] d;
            output   [0:3] q;
        dff f([0–3])   (
                    'RULE_D ,
                    'RULE_Q
                  );
        endmodule
        ('define for specifying text macros is a standard part of the
        Verilog language) .
```

EXAMPLE 5

In EXAMPLE 5, the use of shared interconnection rules is illustrated, wherein interconnection rules are defined using a "define RULE" statement to simplify data entry and provide ease of consistency in iterating common connections.

In accordance with the present invention, Verilog™ code is generated from the above three examples as shown below as EXAMPLE 6 by carrying out a process on the code consistent with the present invention to produce:

```
        module dffX4 (clk,d,q);
            input     clk;
            input [0:3] d;
            output [0:3] q;
        dff f0 (
                    .d      ( d[0] ),
                    .q      ( q[0] ),
                    .clk    ( clk ));
        dff f1 (
                    .d      ( d[1] ),
                    .q      ( q[1] ),
                    .clk    ( clk ));
        dff f2 (
                    .d      ( d[2] ),
                    .q      ( q[2] ),
                    .clk    ( clk ));
        dff f3 (
                    .d      ( d[3] ),
                    .q      ( q[3] ),
                    .clk    ( clk ));
        endmodule // dffX4
```

EXAMPLE 6

Figure 4:
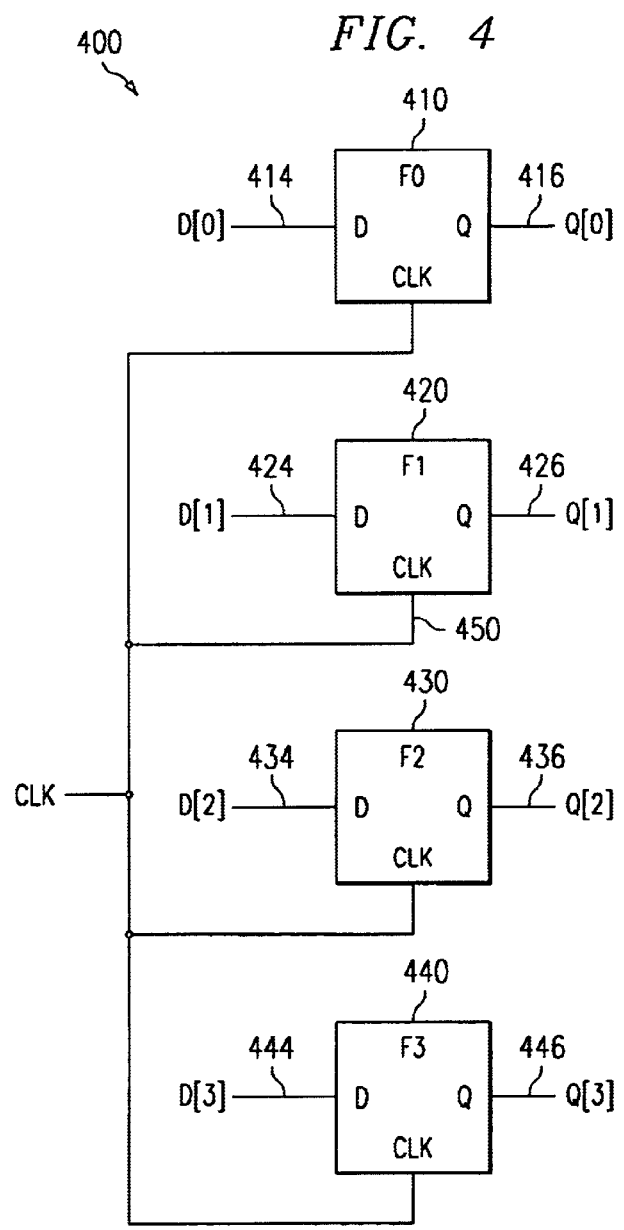
FIG. 4 is a diagram showing the interconnection of four instances of a D flip-flop in accordance with the hardware description of EXAMPLE 6, as instantiated and interconnected by the descriptions of EXAMPLES 3–5.

The hardware description of EXAMPLE 6 is illustrated schematically as 400 in FIG. 4. Each of four instances of the D flip-flop f1, f2, f3 and f4 are shown respectively as 410, 420, 430 and 440. Each of the clock ports are connected by designation of the common clock signal "clk" shown as 450 in each instance. Input signals "d[0 ]", "d[1 ]", "d[2]" and "d[3]" are shown as 414, 424, 434, and 444 respectively. Similarly, output signals "q[0]", "q[1 ]", "q[2]" and "q[3 ]" are shown as 416, 426, 436, and 446 respectively.

In contrast with the code of EXAMPLE 6, the following EXAMPLE 7 uses the Verilog™ 2000 Draft 5 proposed standard preprocessor using a "for-loop", to derive corresponding instances and interconnections:

```
module dffx4 (clk,d,q);
    input           clk;
    input [0:3] d;
    output [0:3] q;
    dff f0 (
genvar i
generate
    for (i=0; i<4; i=i+1)
        begin : inst
            dff d (
                .clk (clk),
                .p (p[i]),
                .q (q[i])
            );
        end
endmodule
```

EXAMPLE 7

The instance names from the IEEE standard of EXAMPLE 7 would be "inst[0].p", "inst[1].p", "inst[2].p", "inst[3].p", ("inst" is a user-specified name, not a Verilog™ language reserved word).

Now consider how the circuit of EXAMPLE 1 given above can be iterated and interconnected using an embodiment of the present invention. The code used for this is given as EXAMPLE 8 below:

```
sms_16b216t0 p([0–3]) (
    .dqi(data[15+16*$1:16*$1]),
    .(cs|ras|cas|we)b ($2x),
    .ba(ba[0]),
    .addr(adr[10:0]),
    .udqm(dqm[2*$1+1]),
    .ldqm(dqm[2*$1]),
    .dev_id(dev_id3[4:0]) );
```

EXAMPLE 8

It should be noted that alternative forms of regular expressions can be provided for such as, for example:

```
sms_16b216t0 p([0123])
sms_16b216t0 p(0|1|2|3)
sms_16b216t0 p([0–3])
``` are acceptable and have the same effect.

The following code shown as EXAMPLE 9 is the resultant Verilog™ code obtained from processing in accordance with EXAMPLE 8 of the present invention:

```
sms_16b216t0 p0 (
    .dqi(data[15:0]),
    .clk(clk),
    .csb(csx),
    .cke(cke),
    .ba(ba[0]),
    .addr(adr[10:0]),
    .rasb(rasx),
    .casb(casx),
    .web(wex),
    .udqm(dqm[1]),
    .ldqm(dqm[0]),
    .dev_id(dev_id3[4:0]) );
sms_16b216t0 p1 (
    .dqi(data[31:16]),
    .clk(clk),
    .csb(csx),
    .cke(cke),
    .ba(ba[0]),
    .addr(adr[10:0]),
    .rasb(rasx),
    .casb(casx),
    .web(wex),
    .udqm(dqm[3]),
    .ldqm(dqm[2]),
    .dev_id(dev_id3[4:0]) );
sms_16b216t0 p2 (
    .dqi(data[47:32]),
    .clk(clk),
    .csb(csx),
    .cke(cke),
    .ba(ba[0]),
    .addr(adr[10:0]),
    .rasb(rasx),
    .casb(casx),
    .web(wex),
    .udqm(dqm[5]),
    .ldqm(dqm[4]),
    .dev_id(dev_id3[4:0]) );
sms_16b216t0 p3 (
    .dqi(data[63:48])
    .clk(clk),
    .csb(csx),
    .cke(cke),
    .ba(ba[0]),
    .addr(adr[10:0]),
    .rasb(rasx),
    .casb(casx),
    .web(wex),
    .udqm(dqm[7]),
    .ldqm(dqm[6]),
    .dev_id(dev_id3[4:0]) );
```

EXAMPLE 9

EXAMPLE 10 and EXAMPLE 11A and EXAMPLE 11B below provides another example of the use of the present invention to instantiate and interconnect using regular expressions and further illustrates the generation of explicit code from implicit interconnections such as "core_clk" and "log_reset_L". This example also illustrates further use of scalars and several variations in how designers can use variations in regular expressions to represent instances and interconnections. This example was generated using an example circuit passed through the prototype system described above to produce two instances of the module.

```
koaqd_oaq_data4      oaqd([01])
(
    .mdprd0_corr_err              ( mdprd0_$1_corr_err ),
    .(mbt|mdprd|msc) ([01])_(.*)$ ( $2$3_$1_$4 ),
    .mhg_oaqd_(.*)$               ( mhg_oaqd$1_$2 ),
    .mhg_corr_err_index           ( 6'b0 ),
    .qdctl(.*)$                   ( qdctl$1$2 ),
    .mopc_s2c_(.*)$               ( mopc$1_s2c_$2 ),
    .mqb_qmu_data                 ( qmu_data ),
    .oaqdp_(.*)$                  ( oaqdp$1_$2 )
);
```

EXAMPLE 10

In EXAMPLE 10, except for the regular expression text added in, this is standard Verilog where:

"koaqd_oaq_data4" is the submodule type name

"oaqd([01])" is the instance name

"mdprd0_corr_err" is a port name on "koaqd_oaq_data4"

"mdprd0_$1_corr_err" is a signal name connected to "mdprd0_corr_err".

This example illustrates several points regarding the current invention's support for iteration and interconnection:

the regular expressions within parenthesis in instance and port names, the "$" denoting the end of the port name, and the "$n" in the signal name.

The "([01])" added in the instance name indicates that the designer wants two instances of "koaqd_oaq_data4" namely "oaqd0" and "oaqd1". Enclosing the range of values within parenthesis means that the range element (0 or 1, depending on the instance) can be referenced from scalar "$1" to form part of a signal name, as shown in the signal "mdprd0_$1_corr_err". The port regular expression ".(mbt|mdprd|msc) ([01])_(.*)$" provides the rule that matches any port on submodule type "koaqd_oaq_data4" that matches the 8 combinations of the first two regular expressions and suffixed with any character.

The code of EXAMPLE 10, after passing through the preprocessing of the present invention, produces the two regular expression generated instances of the module "koaqd_oaq_data4" shown in EXAMPLE 11A and 11B below:

```
koaqd_oaq_data4 oaqd0 (
    .mdprd0_corr_err            ( mdprd0_0_corr_err ),
    .mbt0_found_ff              ( mbt0_0_found_ff ),
    .mbt1_found_ff              ( mbt1_0_found_ff ),
    .mdprd0_data2oaqd           ( mdprd0_0_data2oaqd ),
    .mdprd0_wr_index            ( mdprd0_0_wr_index ),
    .mdprd0_wr_start            ( mdprd0_0_wr_start ),
    .mdprd1_corr_err            ( mdprd1_0_corr_err ),
    .mdprd1_data2oaqd           ( mdprd1_0_data2oaqd ),
    .mdprd1_wr_index            ( mdprd1_0_wr_index ),
    .mdprd1_wr_start            ( mdprd1_0_wr_start ),
    .msc0_wr_index              ( msc0_0_wr_index ),
    .msc0_wr_trans              ( msc0_0_wr_trans ),
    .msc1_wr_index              ( msc1_0_wr_index ),
    .msc1_wr_trans              ( msc1_0_wr_trans ),
    .mhg_oaqd_addr_lower        ( mhg_oaqd0_addr_lower ),
    .mhg_oaqd_index             ( mhg_oaqd0_index ),
    .mhg_oaqd_index_valid       ( mhg_oaqd0_index_valid ),
    .mhg_oaqd_length            ( mhg_oaqd0_length ),
    .mhg_corr_err_index         ( 6'h00 ),
    .qdctl1_corr_err            ( qdctl0_corr_err ),
    .mopc_s2c_oaqd_addr_lower   (mopc0_s2c_oaqd_addr_lower
),
    .mopc_s2c_oaqd_index        ( mopc0_s2c_oaqd_index ),
    .mopc_s2c_oaqd_type         ( mopc0_s2c_oaqd_ptype ),
    .mopc_s2c_trans_valid       ( mopc0_s2c_trans_valid ),
    .mqb_qmu_data               ( qmu_data ),
    .oaqdp_cdp_data             ( oaqdp0_cdp_data ),
    .oaqdp_data2mdp             ( oaqdp0_data2mdp ),
    .core_clk                   ( core_clk ),
    .log_reset_L                ( log_reset_L ),
    .mpd_intraPD                ( mpd_intraPD ),
    .mpd_read_only_region       ( mpd_read_only_region ),
    .mpd_txn_valid              ( mpd_txn_valid ),
    .sync_reset_L               ( sync_reset_L ));
```

EXAMPLE 11A

```
koaqd_oaq_data4 oaqd1 (
    .mdprd0_corr_err            ( mdprd0_1_corr_err ),
    .mbt0_found_ff              ( mbt0_1_found_ff ),
    .mbt1_found_ff              ( mbt1_1_found_ff ),
    .mdprd0_data2oaqd           ( mdprd0_1_data2oaqd ),
    .mdprd0_wr_index            ( mdprd0_1_wr_index ),
    .mdprd0_wr_start            ( mdprd0_1_wr_start ),
    .mdprd1_corr_err            ( mdprd1_1_corr_err ),
    .mdprd1_data2oaqd           ( mdprd1_1_data2oaqd ),
    .mdprd1_wr_index            ( mdprd1_1_wr_index ),
    .mdprd1_wr_start            ( mdprd1_1_wr_start ),
    .msc0_wr_index              ( msc0_1_wr_index ),
    .msc0_wr_trans              ( msc0_1_wr_trans ),
    .msc1_wr_index              ( msc1_1_wr_index ),
    .msc1_wr_trans              ( msc1_1_wr_trans ),
    .mhg_oaqd_addr_lower        ( mhg_oaqd1_addr_lower ),
    .mhg_oaqd_index             ( mhg_oaqd1_index ),
    .mhg_oaqd_index_valid       ( mhg_oaqd1_index_valid
),
    .mhg_oaqd_length            ( mhg_oaqd1_length ),
    .mhg_corr_err_index         ( 6'h00 ),
    .qdctl1_corr_err            ( qdctl1_corr_err ),
    .mopc_s2c_oaqd_addr_lower   (
mopc1_s2c_oaqd_addr_lower ),
    .mopc_s2c_oaqd_index        ( mopc1_s2c_oaqd_index ),
    .mopc_s2c_oaqd_type         ( mopc1_s2c_oaqd_type ),
    .mopc_s2c_trans_valid       ( mopc1_s2c_trans_valid
),
    .mqb_qmu_data               ( qmu_data ),
    .oaqdp_cdp_data             ( oaqdp1_cdp_data ),
    .oaqdp_data2mdp             ( oaqdp1_data2mdp ),
    .core_clk                   ( core_clk ),
    .log_reset_L                ( log_reset_L ),
    .mpd_intraPD                ( mpd_intraPD ),
    .mpd_read_only_region       ( mpd_read_only_region ),
    .mpd_txn_valid              ( mpd_txn_valid ),
    .sync_reset_L               ( sync_reset_L ));
```

EXAMPLE 11B

The present invention is preferably implemented using one or more programmed processors executing programming instructions that are broadly described above in flow chart form. However, those skilled in the art will appreciate that the processes described above can be implemented in any number of variations and in many suitable programming languages without departing from the present invention. For example, the order or sequencing of certain operations carried out can often be varied, and additional operations can be added without departing from the invention. Error trapping can be added and/or enhanced and variations can be made in user interface and information presentation without departing from the present invention. Moreover, although the invention described with reference to the Verilog™ hardware description language, the invention may be applicable to other HDLs to accomplish iteration and/or connection. Also, as previously mentioned, the process described above can readily be integrated within the HDL since it operates as an extension to the HDL syntax, rather than being carried out as a separate pre-processing operation. In either instance, the process can be described by a set of instructions implementing the processes described and stored on a computer storage medium such as a magnetic disc, optical disc, magneto-optical disc, semiconductor memory, etc. Many such variations and modifications are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of iterating instances and interconnections in a Hardware Description Language (HDL), comprising:
    receiving Hardware Description Language code with embedded regular expressions to define instances and interconnections of a module;
    identifying the regular expressions within the code; and
    elaborating the instances and interconnections of the module based upon the regular expressions.

2. The method according to claim 1, further comprising applying HDL grammar rules to the code to assure that the code is compliant with the HDL grammar rules.

3. The method according to claim 1, wherein the elaborating comprises generating a data structure corresponding to the module defined by the code.

4. The method according to claim 3, wherein the elaborating further comprises elaborating the data structure into instances and interconnections of the module defined by the regular expressions in the code.

5. The method according to claim 4, further comprising generating HDL compliant text by traversing the instances and interconnections of the elaborated data structure and translating each instance and interconnection into HDL compliant text.

6. The method according to claim 1, wherein the HDL comprises Verilog™ language elements.

7. The method according to claim 1, wherein the identifying further comprises analyzing the code for key words, operators and user names.

8. The method according to claim 1, wherein the identifying and elaborating of the code is carried out as a pre-processing operation.

9. The method according to claim 1, wherein the identifying is carried out by parsing the code.

10. A method of iterating instances and interconnections in a Hardware Description Language, comprising:
    providing Hardware Description Language (HDL) code using regular expressions to define instances and interconnections of a module; and
    instantiation and interconnection processing the HDL code by:
        analyzing the code to identify the regular expressions;
        applying HDL grammar rules to the code;
        generating a data structure corresponding to the module defined by the code;
        elaborating the data structure into instances and interconnections of the module defined by the regular expressions in the code; and
        generating HDL compliant text by traversing the instances and interconnections of the elaborated data structure and translating each instance and interconnection into HDL compliant text.

11. The method according to claim 10, wherein the HDL comprises Verilog™ language elements.

12. The method according to claim 10, wherein the analyzing further comprises analyzing the code for key words, operators and user names.

13. The method according to claim 10, wherein the instantiation and interconnection processing of the HDL code is carried out as a pre-processing operation.

14. The method according to claim 10, wherein the instantiation and interconnection processing of the HDL code is carried out within the HDL.

15. The method according to claim 10, wherein the analyzing is carried out by parsing the HDL code.

16. A computer system for processing Hardware Description Language (HDL) code, comprising:
    a processor;
    input means coupled to the processor, for receiving HDL code having embedded regular expression descriptions of instances and interconnections;
    storage means coupled to the processor for storing computer programs and data; and
    program means for receiving the HDL code and for elaborating the HDL code into explicit instances and interconnections describing a selected module of hardware based upon the regular expression descriptions.

17. The apparatus according to claim 16, further comprising an HDL program residing on the storage means.

18. The apparatus according to claim 16, wherein the program means further comprises instructions for applying HDL grammar rules to the code to assure that the code is compliant with the HDL grammar rules.

19. The apparatus according to claim 16, wherein the elaborating comprises generating a data structure corresponding to the module defined by the code.

20. The apparatus according to claim 19, wherein the elaborating further comprises elaborating the data structure into instances and interconnections of the module defined by the regular expressions in the code.

21. The apparatus according to claim 20, wherein the program means further comprises instructions for generating HDL compliant text by traversing the instances and interconnections of the elaborated data structure and translating each instance and interconnection into HDL compliant text.

22. The apparatus according to claim 16, wherein the HDL comprises Verilog™ language elements.

23. The apparatus according to claim 16, wherein program means further comprises means for analyzing the code for key words, operators and user names.

24. The apparatus according to claim 16, wherein the elaborating is carried out as a pre-processing operation.

25. The apparatus according to claim 16, wherein the elaborating is carried out in the HDL.

26. An electronic storage medium storing instructions which, when executed on a programmed processor, carry out a process of iterating instances and interconnections in a Hardware Description Language (HDL), comprising:
    receiving Hardware Description Language code with embedded regular expressions to define instances and interconnections of a module;
    identifying the regular expressions within the code; and
    elaborating the instances and interconnections of the module based upon the regular expressions.

27. The storage medium according to claim 26, wherein the instructions further comprising applying HDL grammar rules to the code to assure that the code is compliant with the HDL grammar rules.

28. The storage medium according to claim 26, wherein the elaborating comprises generating a data structure corresponding to the module defined by the code.

29. The storage medium according to claim 28, wherein the elaborating further comprises elaborating the data structure into instances and interconnections of the module defined by the regular expressions in the code.

30. The storage medium according to claim 29, wherein the instructions further comprise instructions for generating HDL compliant text by traversing the instances and interconnections of the elaborated data structure and translating each instance and interconnection into HDL compliant text.

31. The storage medium according to claim 26, wherein the HDL comprises Verilog™.

32. The storage medium according to claim 26, wherein the identifying further comprises analyzing the code for key words, operators and user names.

33. The storage medium according to claim 26, wherein the identifying and elaborating of the code is carried out as a pre-processing operation.

34. The storage medium according to claim 26, wherein the identifying and elaborating of the code is carried out within the HDL.

35. The storage medium according to claim 26, wherein the identifying is carried out by parsing the code.

36. A method of describing a module in a Hardware Description Language (HDL), comprising:
   providing a module name using HDL code;
   creating port descriptions for a port on the module using the HDL code;
   describing instantiation and interconnection of the module with embedded regular expressions within the HDL code; and
   elaborating the module according to the regular expressions describing the instantiation and interconnection.

37. The method according to claim 36, further comprising identifying the regular expressions within the HDL code.

38. The method according to claim 36, further comprising applying HDL grammar rules to the code to assure that the code is compliant with the HDL grammar rules.

39. The method according to claim 36, wherein the elaborating comprises generating a data structure corresponding to the module defined by the code.

40. The method according to claim 39, wherein the elaborating further comprises elaborating the data structure into instances and interconnections of the module defined by the regular expressions in the code.

41. The method according to claim 40, further comprising generating HDL compliant text by traversing the instances and interconnections of the elaborated data structure and translating each instance and interconnection into HDL compliant text.

42. The method according to claim 36, wherein the HDL comprises Verilog™ language elements.

43. The method according to claim 37, wherein the identifying further comprises analyzing the code for key words, operators and user names.

44. The method according to claim 37, wherein the identifying and elaborating of the code is carried out as a pre-processing operation.

45. The method according to claim 37, wherein the identifying is carried out by parsing the code.

* * * * *